United States Patent
Kim et al.

(10) Patent No.: US 6,417,089 B1
(45) Date of Patent: Jul. 9, 2002

(54) METHOD OF FORMING SOLDER BUMPS WITH REDUCED UNDERCUTTING OF UNDER BUMP METALLURGY (UBM)

(75) Inventors: Byung Soo Kim; Chang Hun Lee, both of Kyungki-do (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/632,903

(22) Filed: Aug. 4, 2000

(30) Foreign Application Priority Data

Jan. 3, 2000 (KR) ........................................ 2000-00042

(51) Int. Cl.$^7$ .............................................. H01L 21/60
(52) U.S. Cl. ...................................................... 438/612
(58) Field of Search ........................ 438/612, FOR 343, 438/FOR 369

(56) References Cited

U.S. PATENT DOCUMENTS

| | | | |
|---|---|---|---|
| 5,349,500 A | * 9/1994 | Casson et al. | 174/263 |
| 5,902,686 A | * 5/1999 | Mis | 428/629 |
| 6,251,766 B1 | * 6/2001 | Desai et al. | 438/614 |
| 6,258,703 B1 | * 7/2001 | Cotte et al. | 438/612 |

FOREIGN PATENT DOCUMENTS

EP  0 603 296 B1  11/1992

\* cited by examiner

Primary Examiner—George Fourson
Assistant Examiner—Suk-San Foong
(74) Attorney, Agent, or Firm—Mills & Onello, LLP

(57) ABSTRACT

In a method of forming solder bumps, each solder bump is formed over a corresponding one of a plurality of chip pads of an active upper surface of a semiconductor device. An under bump metallurgy (UBM) is formed on the upper surface of the semiconductor device and the chip pads. A photoresist layer is deposited thereto and patterned to expose the under bump metallurgy on the chip pads. The solder bumps are formed on the under bump metallurgy exposed from the photoresist patterns, and the photoresist patterns are removed. An intermetallic compound layer (IMC) is formed on an interface between the solder bump and the under bump metallurgy by heating the solder bump at a temperature lower than a melting point of the solder bump. Then, the under bump metallurgy is etched by using the IMC as a mask, and the solder bumps are reflowed. The present invention obtains sufficient joint area between the under bump metallurgy and the solder bump as well as joint area between the under bump metallurgy and the buffer layer, and reduces the undercutting of the under bump metallurgy and thereby improves the mechanical and the electrical reliability of the solder bumps.

11 Claims, 6 Drawing Sheets

METHOD OF FORMING SOLDER BUMPS WITH REDUCED UNDERCUTTING OF UNDER BUMP METALLURGY (UBM)

BACKGROUND OF THE INVENTION

1. Field of the Invention

The present invention generally relates to a method of manufacturing semiconductor devices, and more particularly to a method of forming solder bumps with reduced undercutting of under bump metallurgy.

2. Description of the Related Arts

As integrated circuits(ICs) progress in the direction of high mounting density and large scale integration, semiconductor chips comprising a plurality of the ICs are progressing toward miniaturization, requiring an ever-finer pitch between bonding pads. The bonding pads serve as to location at which the circuitry of the semi conductor chip is electrically interconnected to external electronics via bonding wires. As the pitch between pads decreases with miniaturization, it becomes increasingly difficult to apply conventional bonding wires. The fine pad pitch causes several problems such as wire sagging, wire short, and so forth. Further, under the pressing demands of semiconductor products having high speed and high performance, the number of input/output (I/O) pads increases and lower inductance is required. Therefore, as a replacement of the conventional wire bonding technique, a flip chip technique or a DCA (Direct Chip Attachment) technique has been recently introduced.

In the well-known flip-chip technique, the chip is directly mounted to the substrate via solder bumps formed on its chip pads. The solder bumps are commonly formed using an evaporation or electroplating process. Fabrication of the solder bumps using evaporation is a simple process, but is not applicable to a chip having a fine pad pitch. For this reason, the electroplating process has become popular in the formation of the solder bumps.

Under bump metallurgy, referred to in the art as "UBM", is formed between the solder bump and the chip pad. The under bump metallurgy is multi-layered and serves as an adhesion layer, a diffusion barrier, and a solder-wettable layer. A number of techniques are well known in the IC industry for formation of the under bump metallurgy and the solder bump. Typically, the under bump metallurgy is deposited as a continuous layer on the entire active surface of the wafer, and the solder bump is formed on the under bump metallurgy in a region over the chip pad. Following this, the under bump metallurgy is etched using the solder bump as an etch mask.

To carry out the etching of the under bump metallurgy, a dry etching or a wet etching method is used. Dry etching has certain drawbacks in that the bump can be damaged, and, due to anisotropic etching property, it is difficult to thoroughly etch the under bump metallurgy under the mushroom-shaped bump. For these reasons, wet etching has become the more popular technique. However, since wet etching has an isotropic etching property, the under bump metallurgy under the solder bump is often times undercut. As described above, the under bump metallurgy is multi-layered. Therefore, the undercutting of an upper layer of the under bump metallurgy influences a lower layer and thereby, the lower layer of the under bump metallurgy is more severely undercut.

FIGS. 1A and 1B are cross-sectional views illustrating a conventional method of forming solder bumps, and demonstrating resultant undercutting of the under bump metallurgy. With reference to FIG. 1A, a chip pad 12 is formed on an active surface of a semiconductor chip 10, followed by a passivation layer 14 and a buffer layer 16. The passivation layer 14 and the buffer layer 16 have openings for exposing the chip pads 12, respectively. The under bump metallurgy 18 is formed on the chip pad 12, the passivation layer 14 and the buffer layer 16, and comprises multiple layers 18a and 18b. A solder bump 20 is formed on the under bump metallurgy 16 over the chip pad 12.

The under bump metallurgy 18 is etched by using the solder bump 20 as a mask. As a result, as shown in FIG. 1B, each layer 18a, 18b of the under bump metallurgy 18 is undercut. The undercutting of the under bump metallurgy 18 decreases the joint area between the solder bump 20 and the under bump metallurgy 18, and the joint area between the under bump metallurgy 18 and the buffer layer 16. The reduction of the joint area between the under bump metallurgy 18 and the solder bump 20 in turn decreases the height of the solder bump 20. The resultant height of the solder bump 20 formed during a reflowing process depends on the degree of the undercutting of etched under bump metallurgy. Further, the reduction of the joint area between the under bump metallurgy 18 and the buffer layer 16 diminishes the shear strength of the bump 20. The above-described undercutting of the under bump metallurgy 18 mechanically and electrically degrades the reliability of the bump. That is a common defect of the flip chip technique, so-called, controlled collapse chip connection-C4 technique.

A technique for mitigating the above-described shortcomings is disclosed in European Pat. No. 0603296 issued to MCNC Research Triangle Park. In accordance with this technique, prior to etching the under bump metallurgy, the solder bumps are melted to form an intermetallic compound layer on an interface between the solder bump and the under bump metallurgy. Following this, the under bump metallurgy is etched by using the intermetallic compound layer as a mask. In order to prevent flow of the molten solder of the bumps into the under bump metallurgy, solder dams are formed on the under bump metallurgy at regions between the bumps. This technique has certain drawbacks in that it further requires additional steps of forming and removing the solder dams, and this dam structure cannot be applied to formation of a chip having a fine bump pitch.

U.S. Pat. No. 5,902,686 issued to MCNC Research Triangle Park, also discloses etching of the under bump metallurgy using an intermetallic compound layer as a mask. Herein, the intermetallic compound layer is made by melting the solder bump prior to etching the under bump metallurgy. According to this technique, an oxidation layer is formed in replacement of the solder dams for preventing of flow of the molten solder. Since the oxidation layer is formed on the upper surface of the under bump metallurgy, in particular, the copper layer, as well as on the solder bump, this technique also requires an additional step of removing the oxidation layer prior to etching the under bump metallurgy.

SUMMARY OF THE INVENTION

Accordingly, an object of the present invention is to provide a method of forming solder bumps, which can increase joint area between the solder bump and the under bump metallurgy, and thereby reduce the undercutting of the under bump metallurgy.

Another object of the present invention is to reduce the undercutting of the under bump metallurgy by forming an intermetallic compound layer having a greater size than the diameter of the solder bump on an interface between the solder bump and the under bump metallurgy and etching the under bump metallurgy using the intermetallic compound layer as a mask.

Still another object of the present invention is to simplify the process of forming the solder bumps without the need for the additional steps of forming and removing the solder dams or the oxide layer as required by the conventional technique described above.

The foregoing and other objects are achieved by a method of forming solder bumps formed on an active upper surface of a semiconductor device including a plurality of chip pads. An under bump metallurgy (UBM) is formed on a surface of the semiconductor device including the chip pads. Photoresist patterns are formed on the under bump metallurgy, the photoresist patterns exposing the under bump metallurgy. Solder bumps are formed on the under bump metallurgy exposed by the photoresist patterns. The photoresist patterns are removed, and an intermetallic compound layer is formed on an interface between each solder bumps and the under bump metallurgy by heating the solder bumps at a temperature lower than a melting point of the solder bumps. The under bump metallurgy is etched using the intermetallic compound layer as a mask, and the solder bumps are reflowed.

An insulation layer may be formed on the upper surface of the semiconductor device, the insulation layer having openings for exposing the chip pad. The under bump metallurgy may be formed on the insulation layer and the chip pad. The insulation layer may comprise a passivation layer and a buffer layer, the passivation layer comprising an oxide layer or a nitride layer and the buffer layer comprising a polymer selected from the group consisting of polyimide, benzocyclobutene(BCB), polybenzoxazole(PBO), and epoxy.

The under bump metallurgy may comprise a first metal layer on the upper surface of the semiconductor device including the chip pads, and a second metal layer formed on the first metal layer. The first and second metal layers may be respectively comprised of a metal selected from the group consisting of chromium(Cr), copper(Cu), nickel(Ni), titanium(Ti), tungsten(W), vanadium(V), palladium(Pd), aluminum(Al), gold(Au), and their alloys.

The under bump metallurgy may be formed of a nickel layer on the upper surface of the semiconductor device including the chip pads, and a copper layer on the nickel layer. The intermetallic compound layer may be formed of a copper-tin(Cu—Sn) intermetallic compound layer on the interface between the solder bumps and the copper layer.

The solder bumps may be formed by plating solder on the under bump metallurgy exposed from the photoresist patterns. The solder bumps may have a melting point of approximately 320° C., in which case, the intermetallic compound layer is formed by heating the solder bumps at approximately 300° C. In the case where the solder bumps have a melting point of approximately 183° C., the intermetallic compound layer may be formed by heating the solder bump to approximately 170° C. The intermetallic compound layer preferably extends beyond the diameter of the solder bumps prior to reflow of the solder bumps.

In an alternative embodiment, the present invention comprises a method of forming solder bumps on an active upper surface of a semiconductor device including a plurality of chip pads. An insulating layer is formed on an active upper surface of a semiconductor device including the chip pads. An under bump metallurgy (UBM) is formed on the insulating layer, the under bump metallurgy having a relatively deep profile between an upper portion above the insulating layer and a lower portion on the chip pads. Photoresist patterns are formed on the under bump metallurgy, the photoresist patterns exposing the under bump metallurgy. The solder bumps are formed on the under bump metallurgy exposed from the photoresist patterns. The photoresist patterns are removed, and the solder bumps are heated to a temperature higher than a melting point of the solder bumps, the heating forming an oxide layer on the under bump metallurgy. The oxide layer and the under bump metallurgy are etched using the solder bump as a mask; and the solder bumps are reflowed.

In a preferred embodiment, the insulation layer is of a thickness much larger than the thickness of the under bump metallurgy.

BRIEF DESCRIPTION OF THE DRAWINGS

The various features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 1A:
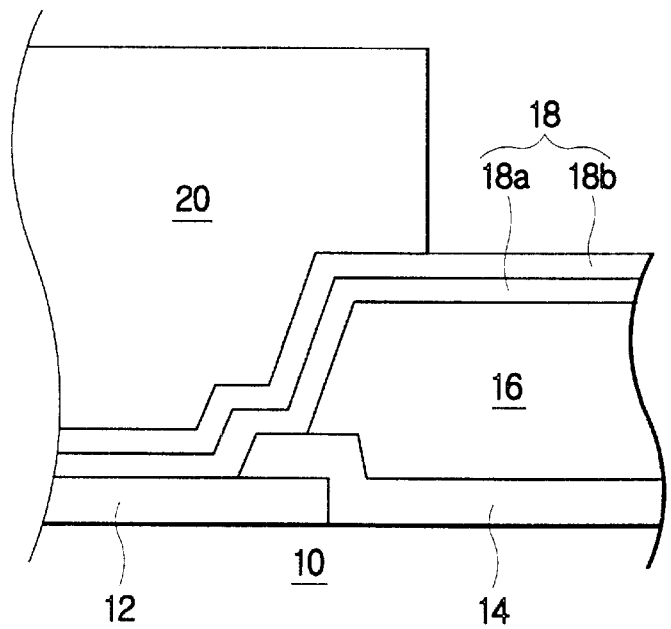
FIGS. 1A and 1B are cross-sectional views illustrating a conventional method of forming solder bumps.
Figure 1B:
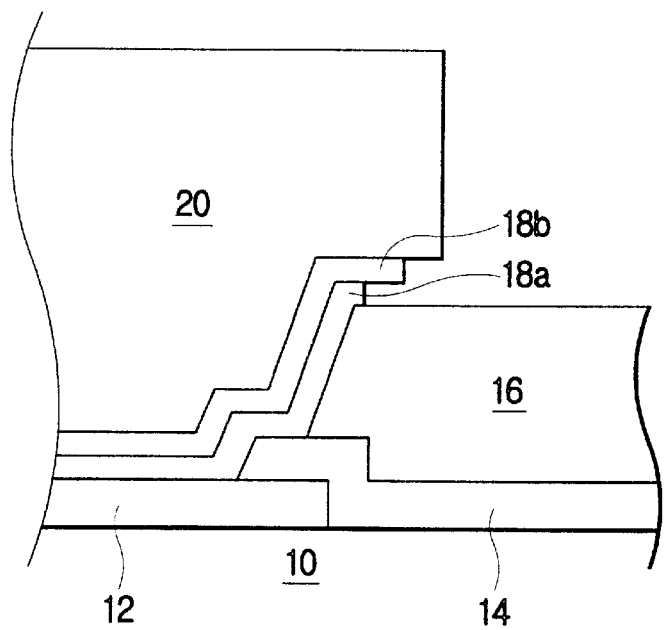
Figure 2A:
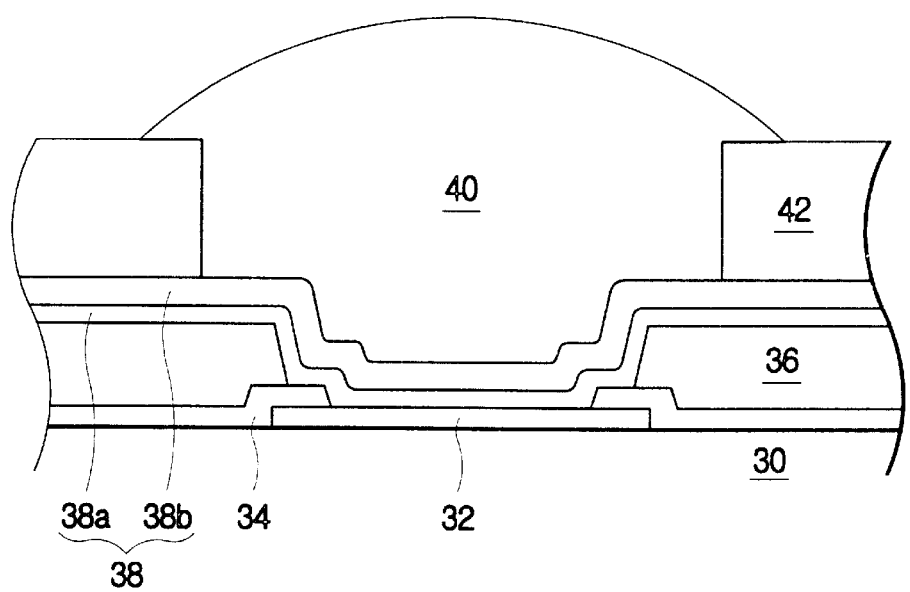
FIGS. 2A to 2D are cross-sectional views illustrating a method of forming solder bumps according to an embodiment of the present invention.

FIGS. 2A to 2D are cross-sectional views illustrating a method of forming solder bumps according to an embodiment of the present invention. With reference to FIG. 2A, a chip pad 32 is formed on an active surface of a semiconductor chip 30, and then a passivation layer 34 and a buffer layer 36 are formed on the semiconductor chip 30. The passivation layer 34 and the buffer layer 36 include openings (not shown) for exposing the chip pad 32, respectively. A plurality of the solder bumps are collectively formed at wafer level. The chip pad 32 may comprise, for example, a metal such as aluminum, and the passivation layer 34 may comprise, for example, an oxide layer or a nitride layer.

The buffer layer 36 preferably comprises a polymer such as polyimide, benzocyclobutene(BCB), polybenzoxazole (PBO), or epoxy, and serves as a buffer for mechanical stresses and as an electrical insulation layer. The buffer layer 36 can be formed by the well known spin-coating method and has a thickness, for example of approximately 5 $\mu$m.

Under bump metallurgy 38 is formed on the chip pad 32, the passivation layer 34, and the buffer layer 36 by, for example, the sputtering or the evaporation methods. Herein, the under bump metallurgy 38 is multi-layered, comprising, for example, a chromium layer 38a and a copper layer 38b. Other metals, for example, nickel(Ni), titanium(Ti), tungsten (W), vanadium(V), palladium(Pd), aluminum(Al), gold(Au)

or their alloy may also be used for the under bump metallurgy 38. Herein, the chromium layer 38a serves as an adhesion layer and a diffusion barrier, and preferably has a thickness on the order of 0.1 µm. The copper layer 38b serves as a solder-wettable layer and has a thickness of approximately 0.4~0.5 µm. A phased chromium/copper layer (not shown) having an about 0.1~0.2 µm thickness may optionally be formed between the chromium layer 38a and the copper layer 38b. The under bump metallurgy 38 further functions as a plating electrode when plating solder to form the solder bump.

Prior to forming the solder bump 40, photoresist patterns 42 are formed. The photoresist patterns 42 can be formed by depositing a photoresist layer and photolithographically patterning the photoresist layer to expose the under bump metallurgy 38 over the chip pads 32. The preferred thickness of the photoresist patterns 42 is approximately 60 µm, and the preferred width of the under bump metallurgy 38 exposed by the photoresist patterns 42 is approximately 120~130 µm. The height of the solder bump 40 plated on the exposed under bump metallurgy 38 through the photoresist patterns 42 is, for example, approximately 70~100 µm.

Figure 2B:
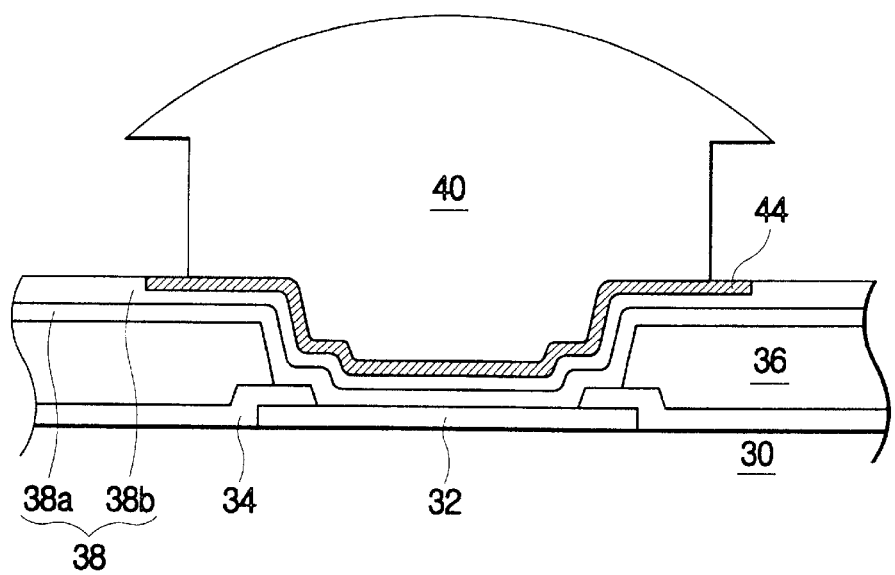

With reference to FIG. 2B, after removing the photoresist patterns 42, a heating step is performed. The heating step is carried out at a temperature slightly less than the melting point of the solder bump 40. At this slightly lower temperature, the bump 40 is not melted and retains its shape. Therefore, it is not necessary to additionally form the solder dams or the oxide layer in order to prevent flow of the molten solder of the bumps into the under bump metallurgy, and thereby the technique of the present invention does not require any additional step for forming and removing the solder dams or the oxide layer, as in the conventional approaches described above.

Figure 3:
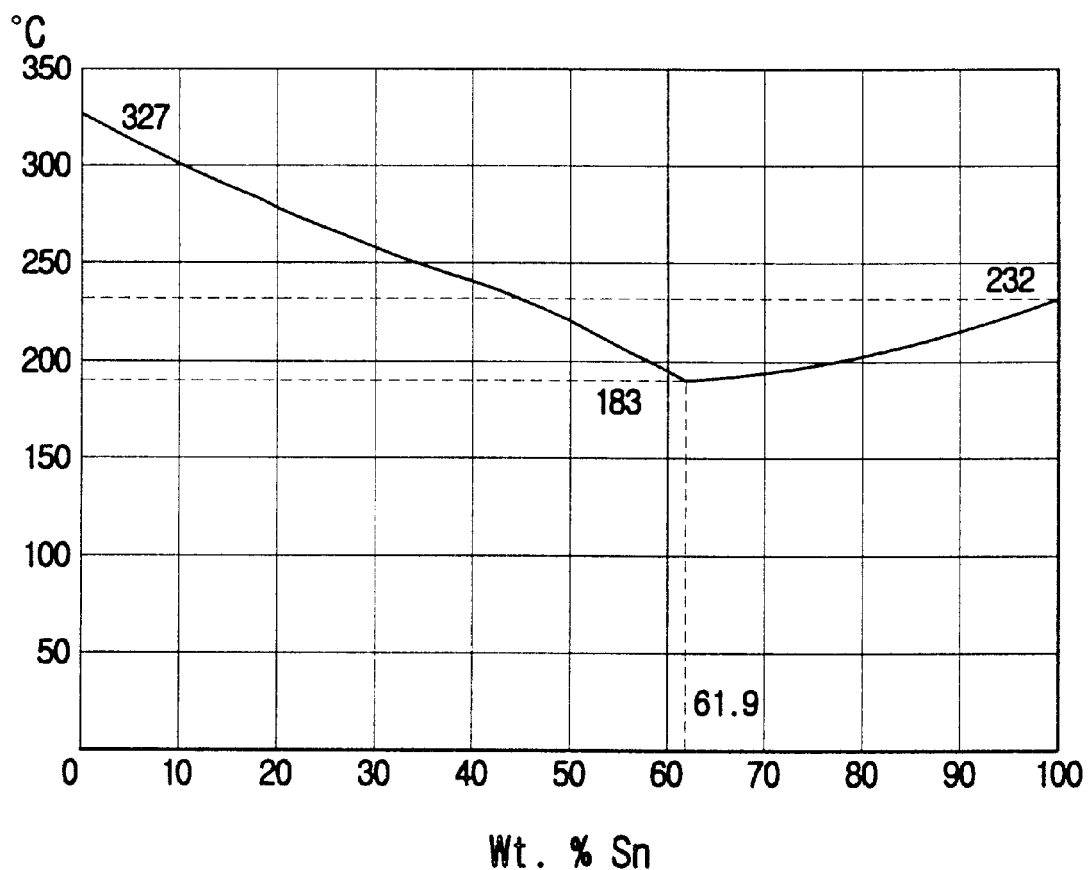
FIG. 3 is a graph showing a change of the melting point of the solder bump as a function of the composition ratio of Sn to Pb in solder.

With reference to FIG. 3, the melting point of the solder bump 40 depends on the composition ratio of the solder, i.e., Pb and Sn, and therefore, the proper temperature of the heating step is dependent on the composition ratio of the solder. For example, assuming a solder comprising Pb and Sn in a ratio of 95:5 by weight, since the melting point of the solder is about 320° C., the heating temperature is properly about 300° C. In case of solder comprising Pb and Sn in a ratio of 37:63 by weight, since the melting point of the solder is about 183° C., the heating temperature is properly about 170° C. The heating step is applied for a duration of preferably about 30 minutes to 1 hour. The heating step is preferably performed under $H_2$ condition, which prevents the oxidation of the under bump metallurgy 38 and the solder bump 40.

Returning to FIG. 2B, during the above-described heating step, a Cu—Sn intermetallic compound layer 44 is formed between the solder bump 40 and the copper layer 38b of the under bump metallurgy 38. The intermetallic compound layer 44 is formed by diffusion of Sn of the solder bump 40 into the copper layer 38b of the under bump metallurgy 38. The intermetallic compound layer 44 is not easily removed by a chemical etchant used in etching the under bump metallurgy 38, and formed more broadly than the diameter of the solder bump 40. Therefore, the under bump metallurgy 38 is etched by using the intermetallic compound layer 44 as an etching mask. As a result, undercutting of the under bump metallurgy 38 under the solder bump 40 is minimized.

Figure 2C:
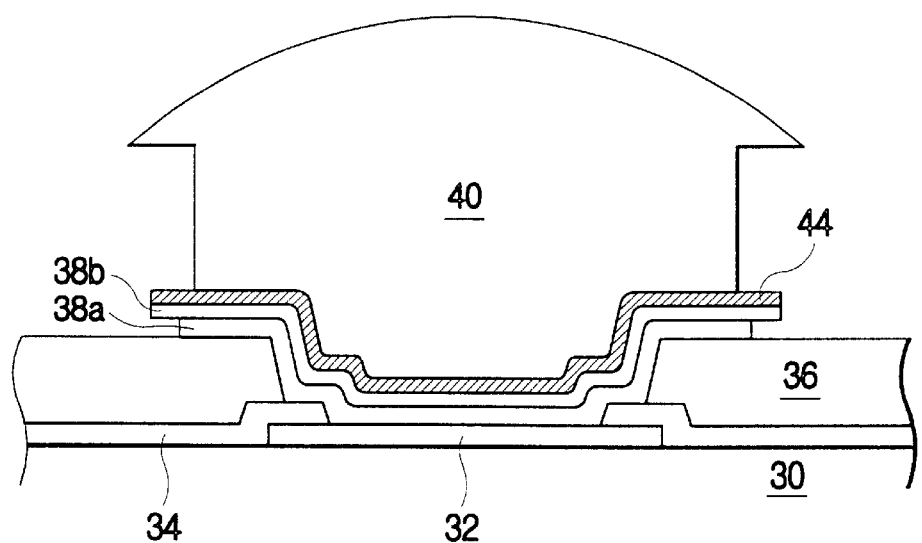

FIG. 2C shows the under bump metallurgy 38 etched using the intermetallic compound layer 44 as the mask. With reference to FIG. 2C, undercutting of the under bump metallurgy 38 occurs, but does not intrude into the perimeter of the solder bump 40. The lateral depth of the undercutting of the under bump metallurgy 38 can be controlled by changing the size of the intermetallic compound layer 44. In this embodiment, the intermetallic compound layer 44 protrudes approximately 1 µm beyond the perimeter of the solder bump 40, and, as a result, the undercutting of the chromium layer 38a of the under bump metallurgy 38 does not intrude within the perimeter of the solder bump 40. That is, minimal undercutting of the under bump metallurgy is provided.

Figure 2D:
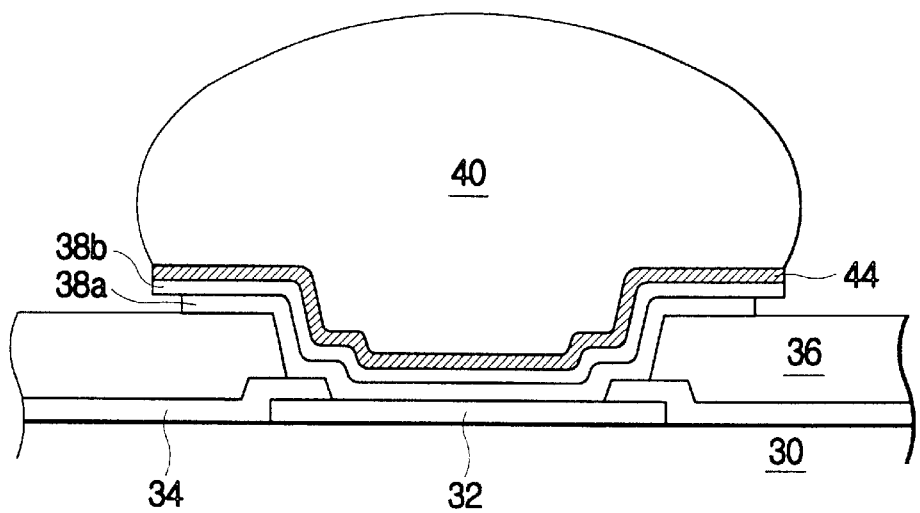

The under bump metallurgy 38 can be etched using a conventional wet etching process. As an etchant, the copper layer 38b uses a mixture of $H_2SO_4$ and $H_2O_2$, the chromium layer 38a uses HCl, and the phased chromium/copper layer uses a mixture of HCl and $H_2O_2$. As described above, the intermetallic compound layer 44 does easily react with these etchants, and is therefore effective as a mask for etching the under bump metallurgy 38. Following this, the reflow process for the solder bump 40 is carried out, according to conventional techniques. FIG. 2D shows the solder bump 40 following the reflow process.

As described above, the intermetallic compound layer 44 between the under bump metallurgy 38 and the solder bump 40 is formed by the heating process, and the under bump metallurgy 38 is etched by using the intermetallic compound layer 44 as the mask. Therefore, it is possible to obtain a sufficient joint area between the under bump metallurgy 38 and the solder bump 40 as well as a sufficient joint area between the under bump metallurgy 38 and the buffer layer 36, and to improve the mechanical and the electrical reliability of the solder bump 40 by reducing the undercutting of the under bump metallurgy 38.

With reference to FIGS. 4A–4D, according to another embodiment of the present invention, the heating process prior to etching the under bump metallurgy is accomplished at a higher temperature than the melting point of the solder.

Figure 4A:
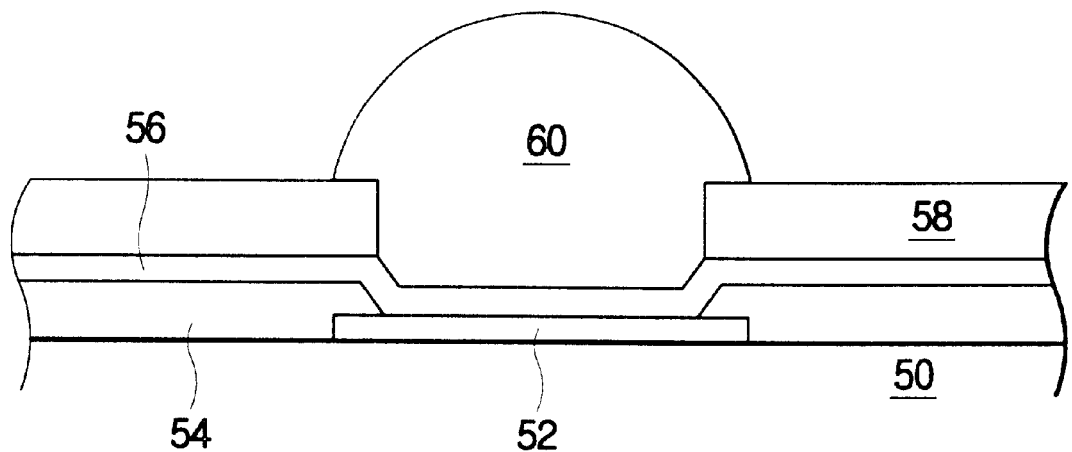
FIG. 4A to 4D are cross-sectional views illustrating a method of forming solder bumps according to another embodiment of the present invention.

With reference to FIG. 4A, a chip pad 52 and an insulating layer 54 are formed on an active surface of a semiconductor chip 50. Herein, the insulating layer 54 refers to the passivation layer and the buffer layer, which are described in the first embodiment. A multi-layered under bump metallurgy 56 is formed on the chip pad 52 and the insulating layer 54. Photoresist patterns 58 are formed on the under bump metallurgy 56, a solder bump 60 is formed on the under bump metallurgy 56 exposed from the photoresist patterns 58.

Figure 4B:
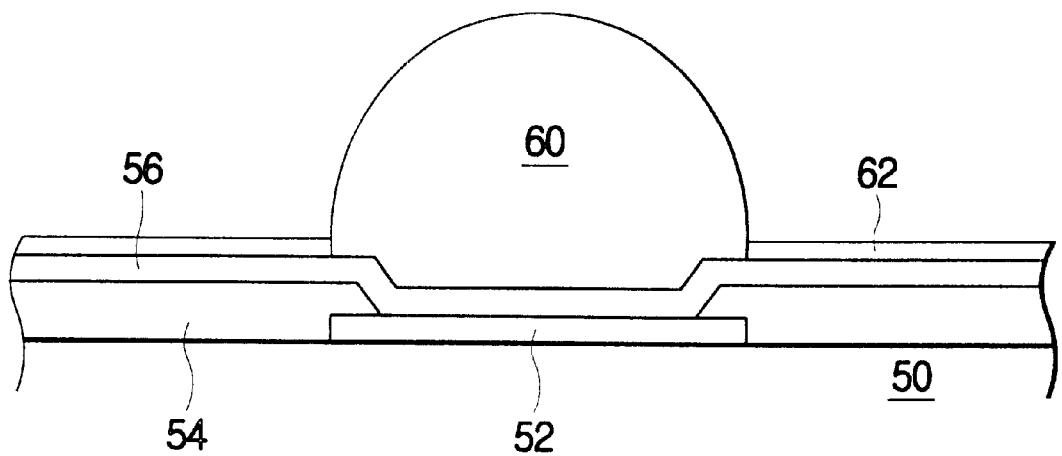

The photoresist patterns 58 are then removed and the heating step is performed. Unlike the embodiment described above, the heating step of this embodiment is designated to be carried out at a temperature slightly higher than the melting point of the solder bump 60. As a result, as shown in FIG. 4B, the solder bump 60 is melted and shaped as a hemisphere. In order to prevent flow of the molten solder of the bump 60 and to maintain its hemispheric shape, the insulating layer 54 has a considerably high thickness such as several tens of µm. Thereby, the under bump metallurgy 56 formed on the chip pads 52 and the insulating layer 54, is shaped as a relatively deep hole in profile between the neck of the resulting recess on the up-set portion of the insulation layer 54 and the base of the recess at the down-set portion on the chip pad 52.

Since the heating step is carried out following removal of the photoresist patterns 58, an oxide layer 62 is formed on the under bump metallurgy 56. For example, in the case where a copper layer is used as an uppermost layer of the under bump metallurgy 56, the oxide layer 62 of the copper layer is naturally formed. This oxide layer prevents the electrical shorts between the solder bumps and assists the solder bump to form the hemisphere shape.

Figure 4C:
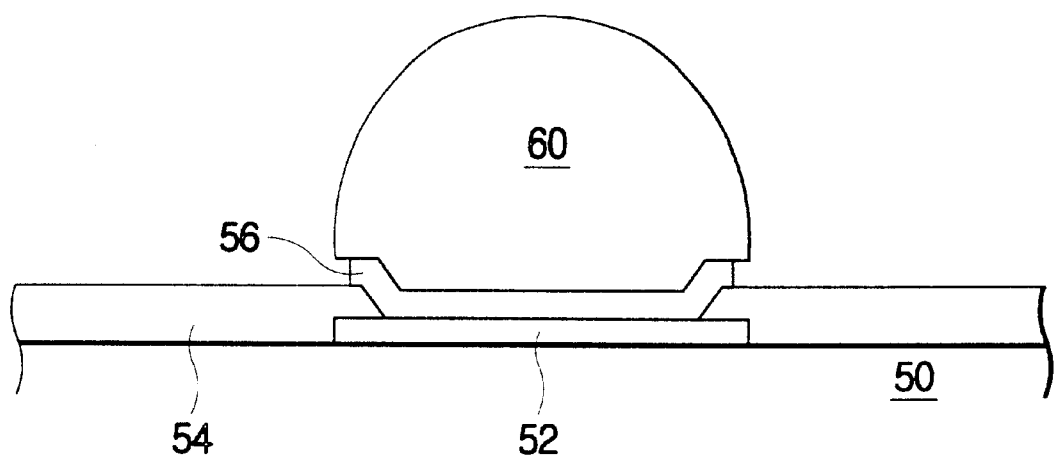
Figure 4D:
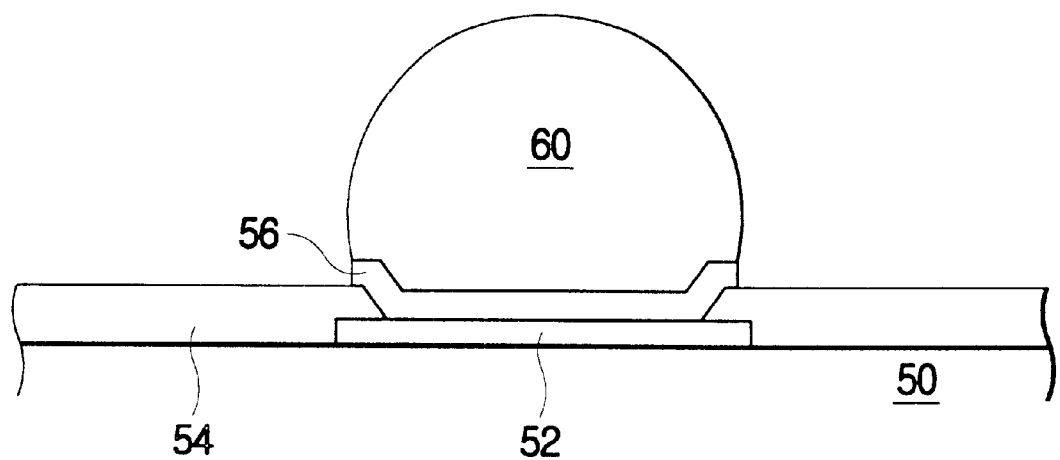

As described above, the under bump metallurgy 56 forms a relatively deep profile between the down-set and the up-set portions, and the oxide layer 62 is formed on a portion of the under bump metallurgy 56, the portion on which the solder bump 60 is not formed. Therefore, by heating the solder bump 60 at a temperature slightly higher than its melting point, it is possible to obtain a sufficient joint area between the under bump metallurgy 56 and the solder bump 60. When the solder bump 60 is melted and becomes shaped as a hemisphere, the joint area between the solder bump 60 and the under bump metallurgy 56 increases, compared with the earlier joint area. Therefore, in etching the under bump metallurgy 56 by using the solder bump 60 as a mask, the depth of the undercutting of the under bump metallurgy can be offset by the increased joint area the solder bump and the under bump metallurgy. FIG. 4C shows of the undercutting of the under bump metallurgy according to the current embodiment, and FIG. 4D shows the solder bump 60 following the reflow process.

The preferred embodiments of the present invention offer advantages in that the joint area between the solder bump and the under bump metallurgy, as well as between the under bump metallurgy and the buffer layer are sufficiently obtained, thereby reducing undercutting of the under bump metallurgy, and resulting in an improvement in the mechanical and the electrical reliability of the solder bump.

Further, since the first embodiment of the present invention accomplishes the heating step at lower temperature than the melting point of the solder bump, there is no need for solder dams or an oxide layer for preventing flow of the molten solder of the bump into the under bump metallurgy; nor is there a need for an additional step for forming and removing the solder dams or the oxide layer, as in the conventional embodiments.

Although the preferred embodiments employ solder bump materials comprising Pb and Sn in a ratio of 95:5 or 37:63 by weight, the present invention is not limited thereto and can vary in a composition ratio of solder. The solder bump can be formed by other method such as the ball placement or the stencil printing, rather than the electroplating.

Further, the present invention is applicable to formation of a solder bump at a different position with respect to the chip pad through the redistribution or the rerouting metal layer, and not directly on the chip pad. This technique using the redistributed metal layer is described in Korean Patent Appln Nos. 1998-35175 and 1998-41724, filed by, and commonly owned by the same assignee as the present invention.

Although preferred embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A method of forming solder bumps on an active upper surface of a semiconductor device including a plurality of chip pads, said method comprising:

forming an under bump metallurgy (UBM) on a surface of the semiconductor device including the chip pads;

forming photoresist patterns on said under bump metallurgy, said photoresist patterns exposing the under bump metallurgy;

forming said solder bumps directly on a pure metal layer of said under bump metallurgy exposed from said photoresist patterns;

removing said photoresist patterns;

forming an intermetallic compound layer on an interface between said solder bumps and said under bump metallurgy by first heating said solder bumps at a first temperature lower than a melting point of the solder bumps;

etching said under bump metallurgy using said intermetallic compound layer as a mask; and reflowing said solder bumps by second heating said solder bumps at a second temperature higher than the first temperature.

2. The method of claim 1, wherein an insulation layer is formed on the upper surface of the semiconductor device, said insulation layer having openings for exposing the chip pads, and wherein said forming the under bump metallurgy comprises forming said under bump metallurgy on said insulation layer and the chip pads.

3. The method of claim 2, wherein said insulation layer comprises a passivation layer and a buffer layer, said passivation layer comprising an oxide layer or a nitride layer and said buffer layer being made of a polymer selected from the group consisting of polyimide, benzocyclobutene(BCB), polybenzoxazole(PBO), and epoxy.

4. The method of claim 1, wherein said forming the under bump metallurgy comprises forming a first metal layer on the upper surface of the semiconductor device including the chip pads, and forming a second metal layer on said first metal layer; and wherein said first and said second metal layers are respectively comprised of a metal selected from the group consisting of chromium(Cr), copper(Cu), nickel(Ni), titanium(Ti), tungsten(W), vanadium(V), palladium (Pd), aluminum(Al), gold(Au), and their alloys.

5. The method of claim 1, wherein said forming the under bump metallurgy comprises forming a nickel layer on the upper surface of the semiconductor device including the chip pads, and forming a copper layer on said nickel layer.

6. The method of claim 5, wherein said forming the intermetallic compound layer comprises forming a copper-tin(Cu—Sn) intermetallic compound layer on the interface between said solder bumps and said copper layer.

7. The method of claim 1, wherein said forming the solder bumps comprises electroplating solder on the under bump metallurgy exposed from the photoresist patterns.

8. The method of claim 1, wherein the solder bumps have a melting point of approximately 320° C., and wherein the intermetallic compound layer is formed by first heating the solder bumps at approximately 300° C.

9. The method of claim 1, wherein the solder bumps have a melting point of approximately 183° C., and wherein the intermetallic compound layer is formed by first heating the solder bumps to approximately 170° C.

10. The method of claim 1, wherein, for each solder bump, the perimeter of the intermetallic compound layer extends beyond the diameter of the solder bumps following the first heating and prior to reflow of the solder bumps by the second heating.

11. The method of claim 1 wherein the solder bumps are formed over the chip pads.

* * * * *